United States Patent [19]

Arlington et al.

[11] Patent Number: 4,661,955
[45] Date of Patent: Apr. 28, 1987

[54] EXTENDED ERROR CORRECTION FOR PACKAGE ERROR CORRECTION CODES

[75] Inventors: David L. Arlington, Essex Junction, Vt.; Chin-Long Chen, Wappinger Falls, N.Y.; Edward K. Evans, Essex Junction, Vt.

[73] Assignee: IBM Corporation, N.Y.

[21] Appl. No.: 692,804

[22] Filed: Jan. 18, 1985

[51] Int. Cl.[4] .......................................... G06F 11/10
[52] U.S. Cl. ................................................... 371/38
[58] Field of Search ...................... 371/38, 37, 10, 11, 371/13; 364/200, 900

[56] References Cited

U.S. PATENT DOCUMENTS

| | | | |
|---|---|---|---|
| 4,139,148 | 2/1979 | Scheuneman | 371/38 |
| 4,319,357 | 3/1982 | Bossen | 371/38 |
| 4,458,349 | 7/1984 | Aichelmann | 371/38 |
| 4,541,093 | 9/1985 | Furuya | 371/38 |
| 4,549,295 | 10/1985 | Purvis | 371/38 |

*Primary Examiner*—Michael R. Fleming

*Attorney, Agent, or Firm*—Sughrue, Mion, Zinn, Macpeak & Seas

[57] ABSTRACT

An extended error code particularly applicable to a code that can correct any number of errors in one subfield but can only detect the existence of any number of errors in two sub-fields. If the initial pass of the data through the error correction code indicates an uncorrected error, the data is complemented and restored in the memory and then reread. The retrieved data is re-complemented and again passed through the error correction code. If an uncorrected error persists, then a bit-by-bit comparision is performed between the originally read data and the retrieved complemented data to isolate the hard fails in the memory. The bits in the sub-field associated with the hard fail are then sequentially changed and then the changed data word is passed through the error correction code. A wrong combination is detected by the error correction code. The sequential changing continues until the bits in the sub-field associated with the hard fail match the originally stored data, in which case the error correction code can correct the remaining errors in the remaining sub-fields.

8 Claims, 6 Drawing Figures

| $E^2CC$ | $E^3CC$ | HFI | COUNT | DECODE OUT | DATA BIT | MODE |
|---|---|---|---|---|---|---|
| 0 | 0 | X | X | 0 | NO INVERT | NORMAL |
| 0 | 1 | 0 | X | 1 | INVERT | $E^3CC$ |
| 0 | 1 | 1 | 0 | 1 | INVERT | $E^3CC$ |
| 0 | 1 | 1 | 1 | 0 | NO INVERT | $E^3CC$ |
| 1 | 0 | X | X | 1 | INVERT | $E^2CC$ |
| 1 | 1 | X | X | - | NOT | ALLOWED |

X = DON'T CARE

FIG. 6

EXAMPLE OF E³CC FOR A 4-BIT PACKAGE

| OPERATION | PKG 1 | PKG 2 | PKG 3 | COMMENTS |
|---|---|---|---|---|
| DATA STORED | 0 0 1 1 | 0 1 1 0 | 0 1 0 0 | NORMAL OPERATION |
| FAILURE TYPE | H H H H | | S | |
| HF STUCK AT | 1 1 1 1 | | | |
| BAD DATA READ (R) | 1 1 1 1 | 0 1 1 0 | 0 0 0 0 | |
| RUN THRU ECC | | | | |
|   BITS IN ERROR | X X | | X | 2 PKG ERR |
| INVERT R ($\bar{R}$) | 0 0 0 0 | 1 0 0 1 | 1 1 1 1 | |
| STORE & READ FROM MEMORY | | | | |
| DATA READ (W) | 1 1 1 1 | 1 0 0 1 | 1 1 1 1 | E²CC |
| INVERT W ($\bar{W}$) | 0 0 0 0 | 0 1 1 0 | 0 0 0 0 | |
| RUN THRU ECC | | | | |
|   BITS IN ERROR | X X | | X | 2 PKG ERR |
| E³CC CYCLE 1 (COUNT=0001 FOR W) |     * | | | |
| INVERT W ($\bar{W}$) | 0 0 0 1 | 0 1 1 0 | 0 0 0 0 | |
| RUN THRU ECC | | | | |
|   BITS IN ERROR | X | | X | 2 PKG ERR |
| E³CC CYCLE 2 (COUNT=0010 FOR W) |   * | | | |
| INVERT W ($\bar{W}$) | 0 0 1 0 | 0 1 1 0 | 0 0 0 0 | E³CC |
| RUN THRU ECC | | | | |
|   BITS IN ERROR | X | | X | 2 PKG ERR |
| E³CC CYCLE 3 (COUNT=0011 FOR W) |   * * | | | |
| INVERT W ($\bar{W}$) | 0 0 1 1 | 0 1 1 0 | 0 0 0 0 | |
| RUN THRU ECC | | | | |
|   BITS IN ERROR | | | X | 1 PKG ERR |
| SINGLE PKG ECC CORRECT | 0 0 1 1 | 0 1 1 0 | 0 1 0 0 | |
| STORE CORRECT DATA IN MEMORY | | | | NO ERRORS |

\* MEANS THAT THE BIT IN W IS NOT INVERTED FOR $\bar{W}$, WHILE THE OTHERS ARE.

EXTENDED ERROR CORRECTION FOR PACKAGE ERROR CORRECTION CODES

TECHNICAL FIELD

This invention relates generally to error correction. In particular, it relates to the correction of a number of hard errors beyond the unextended capability of the error correction code being used.

BACKGROUND

As the size of computer memories has increased while the individual memory cells have become further miniaturized, there has resulted an unacceptable occurrence of bit errors in data stored in a memory. No longer can an occasional error be allowed to cause a program to stop operating or require replacement of a memory chip. These bit errors are of two general types, soft errors and hard errors. A soft error is a seemingly random inversion of stored data. This inversion is caused by occasional bursts of electrical noise and, in some cases, by atomic particles, the so-called alpha particle upset. The soft errors problem has increased as the individual cell sizes have been reduced so that noise levels represent relatively low amounts of power. A hard error, in constrast, represents a permanent electrical failure of the memory chip, often restricted to particular memory locations but also sometimes associated with peripheral circuitry of the memory chip so that the entire chip can be affected. Naturally, designers of memory chips have strived to reduce the occurrence of both hard and soft errors in their chips. However, both types of errors have not been completely eliminated and, indeed, it is not believed that they can be eliminated. Reliability beyond a certain point can be bought only at the expense of reduced performance or increased cost.

An alternative to the above solution for both hard and soft errors has been the implementation of error correction codes (ECC) in large computer memories. The fundamentals of error detecting and correcting are described by R.W. Hamming in a technical article entitled "Error Dectecting and Error Correcting Codes" appearing in the Bell System Technical Journal, Volume 26, No. 2, 1950 at pages 147–160. In one of the most popular Hamming codes, an 8 bit data word is encoded to a 13-bit word according to a selected Hamming code. A decoder can process the 13-bit word and correct any 1 bit error in the 13 bits and can detect if there are 2-bit errors. The described code, thus, is classified as SEC/DED (single error correct/double error detect). The use of such codes has been particularly efficient for memory chips having single-bit outputs. For instance, if a relatively simple computer were to have 16K (16,348) bytes of data where each byte contains 8 data bits, then an efficient errorprotected design would use thirteen 16K×1 memory chips with the extra five 16K chips providing a Hamming SEC/DED protection. The Hamming code can correct only a single random error occurring in any byte but can further correct for any one failed 16K memory chip since any one memory chip contributes only 1 bit per each error-protected word.

Of course, the described 13-bit Hamming code could only correct one error, whether it be a hard error or a soft error. As a result, if one memory chip has suffered a hard failure in all its locations, then the remaining chips are not protected against an occasional soft error although it could be detected but not corrected. For this and other reasons, more elaborate error correcting codes have been developed and implemented. As a general rule, the more errors that can be corrected in a word, the more extra bits are required for the check code.

Hamming codes and similar codes are thus useful for correcting hard errors when each bit of data word is stored in a different memory chip. However, the trend has been toward memory chips of ever increasing density. Single memory chips having 1 megabit of capacity, or even 4 megabits, will soon become commercially available. However, many systems do not require 1 megabyte or 4 megabytes of storage. This large amount of storage would result when these larger chips are used to store only a single bit of every data word. As a result, it is anticipated that many systems will use the larger memory chips to store multiple bits of the same data word. For instance, a 1 megabit memory chip can be easily adapted to have 4 data ports, each simultaneously accessible. This chip would then be properly designated as a 256K×4 memory. Eight of these 1 megabit chips would then provide 256K of storage for 32 bit words. Error protection will likely need to be provided for such a large memory based upon such a dense memory chip. Soft errors, of themselves, do not present much of a problem because of their random occurrence in one or a few memory locations. Hard errors, however, present a much more difficult problem for multi-bit memory chips. The problem is that the hard error is often not restricted to a single bit output port but affects all the bits associated with the memory package. In the 256K×4 package described above, this means that a hard error is likely to produce four simultaneous errors in the same word. Error correction codes are available for handling this large number of errors and, indeed, error correction codes can be developed for almost any number of errors in a word. However, such codes require a large number of extra bits to perform such large scale correcting.

Recently, a better procedure has been developed for dealing with hard errors in multi-bit packages. These errors will be referred to as package errors and the error correction codes designed specifically for package errors will be called package codes. These codes rely upon the fact that the multiple hard errors do not randomly occur across the entire field of the data word. Instead, the multiple errors are confined to a sub-field of the data word, defined by the outputs of the package. In the context of the previously described example, such a code cannot correct any four errors occurring in the 32-bit word. However, the code can correct four-bit errors that occur in any one of the eight 4-bit sub-fields.

Nonetheless, even such codes are not completely satisfactory. If the code is a SPC/DPD (single package correct/double package detect) code, then the code can correct any errors that occur in only one package and can detect, but not correct, errors occurring in two packages. Thus if one package has suffered a hard failure, the occurrence of any additional errors, either hard or soft, in the remaining packages means that the error condition can be detected but the errors cannot be corrected. Thus, the existence of one hard failure is the effective limit of correction provided by a SPC/DPD code.

Woo in U.S. Pat. No. 3,449,718 has proposed a novel method of correcting errors, particularly applicable to magnetic tapes. Magnetic tapes have parallel tracks with the parallel locations defining a byte. One of the tracks or parallel bits is dedicated to a check bit that records the parity of the remaining bits of the byte. The bytes are further arranged on the tape in fairly long blocks. At the end of a block, there are several additional recorded bytes that provide a block check. That is, the bits of the block check must be consistent with the previous data and check bits. The parity check bits can only detect, but not correct, a single error. In Woo's apparatus the assumption is made that all errors within a block occur in a single track, an assumption that is likely for magnetic tape recording. Woo then reads the tape with the assumption that the errors are occurring in the first track. He reads the tape, byte by byte, and checks for parity errors. If a parity error is indicated within a particular byte, the bit in the first track is inverted. Data, with possible inversions, is then subjected to comparison with the block check bits. If the initial assumption was correct, the data was corrected and the block check bits indicate correct data. However, if the initial assumption were incorrect, then the assumption is changed to one that all errors are occurring in the second track. The data is then reread from the tape with parity errors causing inversion in the second track. The process is repeated until agreement with the block check bits is obtained or until after the tape has been read with each track being separately assumed to contain errors. An example of package codes for detecting package errors is disclosed by Kaneda et al in a technical article entitled "Single Byte Error Correcting—Double Byte Error Detecting Codes for Memory Systems" appearing in IEEE Transactions on Computers, vol. C-31, No. 7, July 1982 at pp. 596–602. Further examples of package codes and their hardware implementation are disclosed by Bossen in U.S. Pat. No. 3,629,824 and by Chen, one of the present inventors, in U.S. Pat. No. 4,464,753. Closely related to Chen's patent is U.S. Pat. No. 4,319,357 to Bossen which discloses the use of SEC/DEC code to correct double errors, one of which is a hard failure. The storage location of the erroneous word is checked for a stuck bit. A new syndrome is calculated and compared with the syndrome of the erroneous word to locate the transitory error.

Hsiao et al, in a technical article entitled "Double-Error Correction" appearing in the IBM Technical Disclosure Bulletin, Vol. 14, No. 4, September 1971 at p. 1342 discloses a method of using a single error correcting (SEC) code to correct a double error by consecutively inverting bits until only a single error remains, which can be corrected by the code. However, this technique provides no localization of the errors. Furthermore, the inversion of a correct bit produces three erors which the code must unambiguously detect as an error.

Scheuneman et al in U.S. Pat. No. 4,139,148 disclose a method of correcting double errors with a single error correcting (SEC) code. Whenever a single error is detected, the syndrome bits used to correct the error are stored. If, subsequently, the same word produces a detection of a double error, the previously stored syndrome is used to correct one of the errors. Bossen et al in a technical article entitled "A System Solution to the Memory Soft Error Problem" appearing in IBM Journal of Research and Development, vol. 24, No. 3, May 1980 at pp. 390–397 discuss the problem of simultaneous hard and soft errors. One solution, applicable to a subclass of errors, is to complement the read data, store the complement in the original memory location, reread the complemented data and recomplement it. In some but not all combinations of hard failures and data, this complement and retry technique overcomes these hard failures.

Carter in U.S. Pat. No. 3,949,208 also describes an extended error correction technique utilizing complement and retry.

SUMMARY OF THE INVENTION

Accordingly, it is an object of this invention to provide for the correction of multiple errors in a data word.

It is a further object of this invention to provide for the correction of errors occurring in more than one package when the error correction code is capable of correcting only single package errors. The invention can be summarized as an extension of the retry method for correcting hard errors that have been detected but cannot be corrected by the error correction code that is being used. A data word is read and stored in a register. The error correction code operates on the data word and when it detects an uncorrectable multi-package error, the originally read word is complemented before being restored in the original location. The complemented word is then retrieved and recomplemented and passed through the error correction code. If an uncorrectable error still results, the once complemented word is compared bit-by-bit with the originally read word stored in the register to determine in which packages hard errors have occurred. Once the boundaries of the hard error have been found, the bits in the data sub-field are sequentially changed in the retrieved, once complemented word. The selectively changed word is then complemented and passed through the error correction code. If an uncorrectable double-package error still results, another combination of change bits is attempted until the change-bit pattern of the sub-field matches the error-free originally stored data with the result that the error correction code can correct the error in the remaining erroneous sub-field.

BRIEF DESCRIPTION OF THE DRAWINGS

FIG. 6 is a table illustrating an example of the operation of the present invention.

DETAILED DESCRIPTION OF THE PREFERRED EMBODIMENT

One embodiment of the invention is described with reference to an SPC/DPD (single package correcting/double package detect) code than can correct any number of errors in one package but can only detect the existence of errors in two packages. Any SPC/DPD code can be used, such as those of Kaneda et al or of Chen, previously referenced. A complement and retry technique is used to identify one or more of the packages having hard errors. Since the SPC/DPD code can detect any number of errors in that package, possible combinations of data are tried for that package until the SPC/DPD code no longer detects errors in the identified package. Any incorrect combination results in an error detection. Once the correct combination has been found, the code can additionally correct the errors in the remaining error-containing package.

Figure 1:
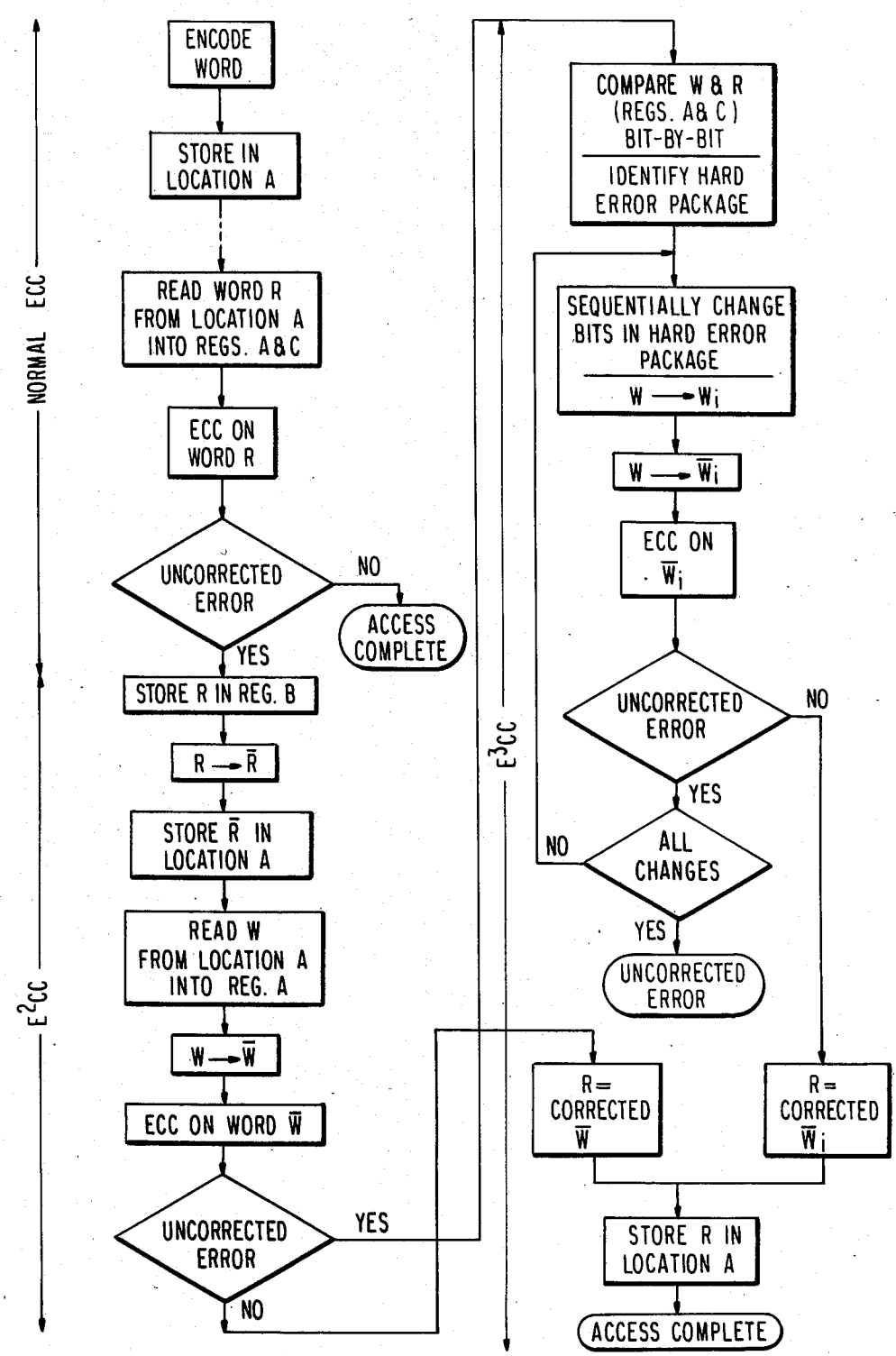
FIG. 1 is a flow diagram illustrating the extended error correction provided by this invention.

The flow diagram for the operation of the invention is illustrated in FIG. 1. A data word is first encoded according to a SPC/DPD code. The encoded word is stored in its proper location A in a memory along with the check bits resulting from the encoding. These first two steps occur whenever during normal processing a data word is to be stored in the memory. Of course, the location A in the memory will vary according to the identification of the data word.

Sometime later, the computer will need the information stored at the particular location A in memory. The computer reads the word from the designated location A, which word will be called R. The word R and its various permutations used in this invention will be understood to include both the data bits and the associated check bits, unless otherwise specified. The read word R may differ from the word originally stored at the designated location because of either hard or soft errors. The read word R is latched into registers A and C. The SPC/DPD procedure is executed upon the word R from register A. If the read word R contains no errors, or if it contains errors restricted to a single package, then there will be no uncorrected errors since the SPC/DPD code can correct all the errors in one package. In this case, the access is complete because either the read word R is correct or has been corrected and the corrected word R can be used. The above procedure is normal EEC processing.

If, however, there are errors in two different packages, the ECC procedure can only indicate the existence of this condition and cannot correct. If errors occur in more than two packages, the ECC may, in some situations, flag the condition as an uncorrected error. However, in some other conditions, the condition will not be flagged as an uncorrected error. At this point the first stage of extended error correction, called $E^2CC$, is initiated. If there is an uncorrected error, the value of the read word R is also stored in a register B, and R is also inverted to its complemented value. The complemented value $\bar{R}$ is then stored back in the original designated location A in the package memory. Immediately, this same location A is read into register A, and the retrieved complemented data is designated as W. This value is then inverted to the recomplemented retrieved data $\bar{W}$. The value of $\bar{W}$ should equal the value of R because of the two intervening inversions. However, if the memory has suffered a hard failure such that its output value is stuck either high or low regardless of the input value to that bit, then $\bar{W}$ does not equal R. However, it must be remembered that if the cause of the originally detected error was a soft error, then for at least those soft error bits, the double inversions reproduce the original value of R.

The ECC code is then applied to the recomplemented retrieved data $\bar{W}$. It is possible that the ECC can correct the word $\bar{W}$ even though it differs from the originally read word R. This situation would arise when, for example, the four bits of a package all fail at a high value of (1111) when a value of (0000) was originally stored there. Then, assuming errors in just one other package, the initial ECC processing of R would detect a double package error. The once complemented value of the faulty four bits would be (0000). Upon being stored and retrieved from the designated location, these bits would once more appear at their originally correct, but complemented, values, that is, (1111). However, the recomplementation of $\bar{W}$ returns these values to their true value of (0000). If the error in the one remaining faulty package remains after the double inversion, the SPC/DED code can handle the errors in this one package.

If there is no indication of an uncorrected error after this ECC processing, then the corrected value from the ECC is used for the value of the originally read word R. It is recommended that this new value of R be immediately restored in the designated location A in memory because one of the errors so detected may have been a soft error. Soft errors do not indicate a bad memory location but only that the data been inverted at that location. Once the data has been correctly restored at that location, it is highly unlikely that it will reinvert. However, soft errors accumulate over time and may accumulate to the point that they become too numerous in any word to correct. Thus it is advisable to correct any soft error as soon as it is detected in what is described as a scrubbing operation. This completes the $E^2CC$ process involving complement and retry.

If, however, the ECC processing of the recomplemented retrieved word still produces a flag of an uncorrected error, then the next level of extended error correcting, called $E^3CC$, is implemented as follows. A bit-by-bit comparison of W and R is made from their values stored respectively in registers A and C. Any true comparison between the bits indicates that the double inversion with the intervening store did not reproduce the same bit value. That is, the bit location is the package is stuck at some value, a hard failure. This comparison is made to find at least one hard failure in one of the two packages with errors. The location of the hard failure isolates or identifies one of the two bad packages within the data word. Of course, if all the errors in one of the packages were soft errors, the comparison would not identify this package. It is to be noted that the procedure thus relies upon there being a hard error in at least one of the two error-containing packages. If all the errors are soft errors, the present procedure cannot correct the data.

At this point, one of the faulty packages has been identified, and it is assumed that additional errors are restricted to only one further package. As a result, the data contained in the identified package becomes almost irrelevant. Of the 16 possible combinations of data in the identified package, the SPC/DPD code can detect the 15 wrong combinations. The 16th and correct combination, combined with the rest of the word, results in a full data word with errors localized to one other package. The ECC code can correct this situation. Thus, the various combinations of data in the identified package are passed through the ECC code until it can correct the word. The preferred procedure will now be described.

The value of W stored in register A is used as a starting point. The bits associated with the identified hard error package are sequentially and one-by-one changed to produce a changed data sub-word $W_i$ which is combined with the bits of the other packages which are not being changed. A counter and decoding logic can be used for the change process. After each change of a bit, a changed word $W_i$ is complemented to $\bar{W}_i$ along with the bits of the remaining packages and this value is passed through the ECC. If an uncorrected error continues to be flagged by the ECC and some of the 16 combinations in the identified package remain to be tried, the process continues. Once the combination in the identified packages matches the data originally stored in the memory, then the changed data word $\overline{W}_i$ contains errors in only one package, and the SPC/DPD code can correct these remaining errors. This, of course, assumes that the originally detected errors were restricted to only two packages. If no uncorrected error is flagged, the corrected value of $\overline{W}_i$ is used for the corrected value of R and this value is restored in memory in order to scrub soft errors. The memory access of R is thus completed.

If all 16 combinations of data in the identified package still do not produce a fully corrected word, it is assumed that the ECC had initially detected errors in three or more packages or possibly that the hard errors are intermittent within the extended EEC cycle. The described embodiment is incapable of handling these situations and an uncorrected error is flagged.

If two packages have been identified as containing hard errors, then it is preferable simultaneously to change the bits in both of them since this is likely to more quickly produce one correct combination.

A hardware implementation of the extended error correction of the present invention will now be described. The memory system shown in FIG. 2, consists of four memory packages 10 each having four bits of output. An ECC logic 12 is provided which implements a single package correct/double package detect (SPC/DPD×4) code for a resultant 16 bit protected data word, divided into four sub-fields each of four bits. The designation ×4 indicates the specific package width of 4 bits for the code. This SPC/DPD×4 code requires 15 checkbits. Kaneda et al, in the previously cited article, describes an example of EEC logic 12 of the class needed for this invention. It must be noted that the embodiment described here is for illustrative purposes only and that other sizes of data field and of sub-fields are common in the computer industry. However, these differing sizes present no fundamental changes to the invention. The ECC logic can correct up to four bit errors occurring in any one of the four memory packages 10 and outputs the corrected data to a B register 14. The ECC logic 12 can also detect any number of bit errors occurring in any two of the memory packages 10. However, it cannot further specify the location of the double package errors but can only output an uncorrected error signal. The existence of errors in three or four packages 10 may or may not be flagged by the ECC logic that is designed to unequivocally detect only double package errors.

The invention further provides an ECC extender 16 associated with each one of the memory packages 10 and receiving four bits of data from that package 10 through a 16-bit A register 17. The ECC extender 16 also provides four of the 16 bits of data to the ECC logic 12. The data which the extender 16 provides to the ECC logic 12 may be the original data from the associated memory package 10 or the data may be modified according to the process described before. A controller 18 receives the signal for an uncorrected error from the ECC logic 12 and controls the operation of the ECC extender 16. An $E^2CC$ signal from the controller 18 indicates that the extended error correction is in the initial stage of complement and retry while a $E^3CC$ signal indicates that a counter 20 is changing the bits of the sub-field associated with a memory package 10 having a hard failure.

Figure 3:
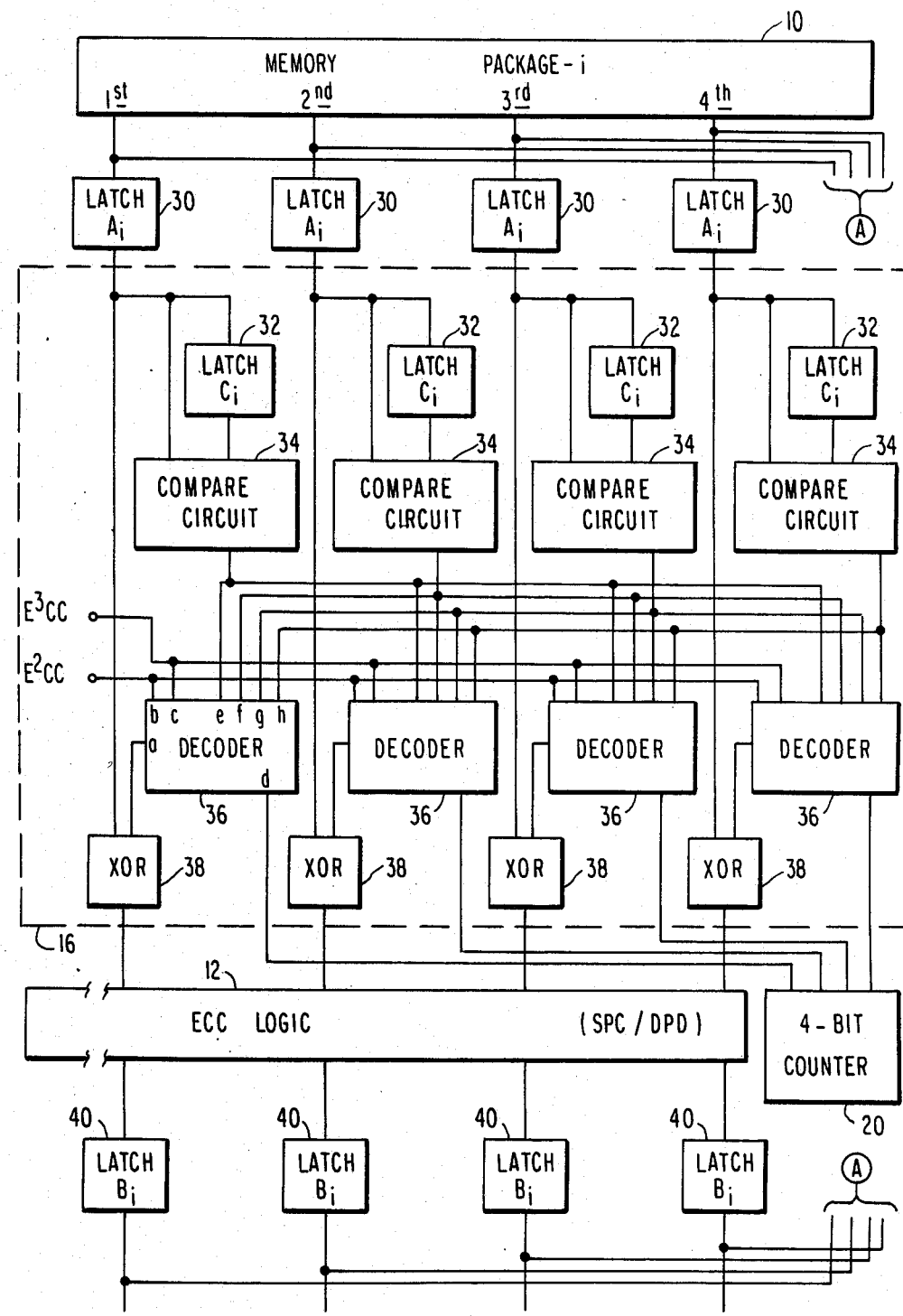
FIG. 3 is a circuit diagram of an embodiment of the ECC extender for use with this invention.

The details of the ECC extender 16 are shown in FIG. 3. Each of the outputs is of one of the memory packages 10 is connected to an associated A latch 30 which forms ¼ of the A register 17, previously referred to. The output of each of the latches 30 is connected to the input of an associated C latch 32 which forms ¼ of the previously mentioned C register. Both sets of latches 30 and 32 are latched by the controller 18, and the C latches 32 are used for storing the R for the bit-by-bit comparison. A set of four compare circuits 34 receive inputs from a respective pair of one of the A latches 30 and one of the C latches 32 and outputs a high or 1 signal when the two bits of input are equal. This comparison is the bit-by-bit comparison of W and R.

The output of each one of the compare circuits 34 is fed to one of the inputs e, f, g, and h of 40 decoders 36. Each decoder controls the selective inversion of the data bit latched in the associated A latch 30. The selective inversion is performed by an exclusive-OR gate 38. Each exclusive-OR gate 38 provides as its output one of the 16 inputs to the ECC logic 12, only four of which are shown in the memory system of FIG. 3. The outputs of the ECC logic 12 are separately latched in B latches 40. Sixteen of the B latches 40 form the B register 14. The four-bit counter 20 has four output lines each connected to an input d of a different one of the four decoders 36.

Figures 4, 5:
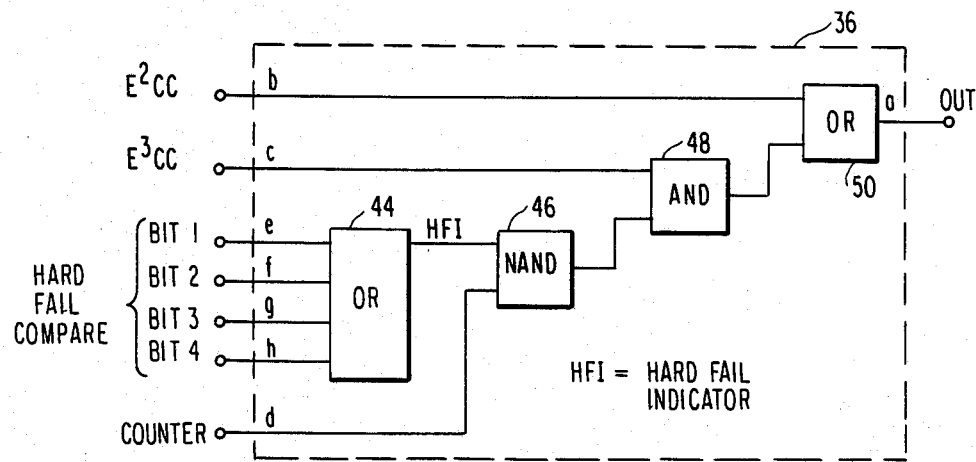
FIG. 4 is a circuit diagram of an embodiment of a decoder used in the ECC extender of FIG. 3.
FIG. 5 shows a truth table for the decoder of FIG. 4.

The decoder 36 is composed of logic gates, as shown in FIG. 4. The four inputs e, f, g and h to an OR-gate 44 indicate which of the bits of the associated memory package 10 has a hard failure, as indicated by the results of the complement and retry test. A high value on any one of these inputs produces a high value on the HFI (hard failure indicator) output. If a hard failure has been indicated for any of the bits of the associated package, then the bits within the hard-failed package will be changed in the $E^3CC$ procedure as the counter counts through. It should be noted that the bits in the sub-word $W_i$ are sequentially changed and the entire changed sub-word is complemented to $\overline{W}_i$. These operations are combined by inverting every bit in the exclusive-OR gates 38 except the bits to be changed, which are used in their uncomplemented state. A high value of the hard failure indicator signal HFI thus causes the value of the 1-bit counter signal to be inverted in a NAND gate 46 and then passed through an AND-gate 48 when the $E^3CC$ signal is high (that is, different combinations are now being tried). The counter signal then passes through an OR-gate 40 to the output a. A high $E^2CC$ signal also passes through the OR-gate 50 when the initial complement and retry procedure is being executed, thus causing all the bits of the data word to be inverted. When neither the $E^2CC$ signal nor the $E^3CC$ signal is high, then the output of the OR-gate 50 is low so that the exclusive-OR gate 38 passes the uncomplemented value in the A latch 30 to the ECC logic 12.

The truth table for the decoder 16 is given in FIG. 5 with the $E^2CC$ and $E^3CC$ signals and the 1-bit count signal as inputs. The value of the hard failure indicator HFI is high whenever one of the hard fail comparison signals e, f, g and h are high. If both the $E^2CC$ and $E^3CC$ signals are low, then the decoder outputs a 0 so that the data bit is not inverted. This is the normal mode of operation for the initial attempt at error correction, exclusive of the extended ECC of this invention.

If the controller 18 outputs the signal $E^2CC=0$ and $E^3CC=0$, then the initial phase of error correction is being attempted for the word R latched in the A latches 30. The decoder 36 then outputs a 0 so that the data and check bits are passed to the ECC logic 12. The output of the ECC logic 12 is latched in the B latches 40. If the data is correct or correctable, then the ECC logic 12 outputs a valid data signal for the data in the B latches 40. An invalid data or uncorrected error signal indicates to the controller 18 that further error correction is required. For an uncorrected error, the uncorrected data word passes through the ECC logic to the B latches 40.

If the controller 18 outputs the signals $E^2CC=1$ and $E^3CC=0$ (based on an uncorrected error signal resulting from the EEC check of the initially fetched data), then the complement and retry or $E^2CC$ stage of the extended error correction is being attempted. The data in the B latches 40 is passed back to the A latches 30. This pass back allows pipelined operation wherein a subsequent data word may already have been stored in the A latches 30. The decoder 36 then outputs a 1 so that all data and check bits of the data word are inverted regardless of the value of the hard fail indicator and the count. The inversion produces the word $\overline{R}$ which is passed unchanged through the ECC logic 12 to the B latches 40 and then stored in the memory package 10 at location A. Location A is then read and its contents latched into the A latches 30. The decoder 36 continues to output a 1 so that all data and check bits are inverted. This is the complementing of W to $\overline{W}$, preformed to isolate the hard failure and possibly to correct the error.

If however, the controller 18 outputs the signals $E^2CC=0$ and $E^3CC=1$ (based on an uncorrected error signal resulting from the EEC check after the double complement or $E^2CC$ step), then the second or $E^3CC$ stage of the extended error correction is being attempted, that is, the bits of a hard failure memory package 10 are being changed. If HFI=0 for this decoder 36, then the hard failure is occurring in some other memory package 10. In this case, the inversion is performed regardless of the value of the count, as $W_i$ is being complemented to $\overline{W}_i$ without any change of the bits. If HFI=1, then there is at least one error in the memory package 10 associated with this decoder 36. Under these conditions, the decoder outputs a 1 when the counter 20 outputs a 0 to this decoder 36. As a result, the associated data bit is inverted in the exclusive-OR gate 38 for the normal complementing of $W_i$ to $\overline{W}_i$. However, when the count from the counter 20 is 1, the decoder 36 outputs a 0 so that no inversion is performed by the exclusive-OR gate 38. This is equivalent to complementing a changed bit.

It is thus seen that the counter 20 controls the bit to be changed in the data word originating from the memory package 10 having a hard failure. If more than one package 10 has a hard failure, then the changes are performed simultaneously in the separate packages 10. The counter should begin at an initial count of 1. A count of 0 does not need to be attempted because this count corresponds to no changes and this case was already tested in the normal ECC processing of the word R. In the general case of n-bit memory packages 10, the count proceeds for $2^n-2$ counts. The final count of $2^n-1$, (1111) for the four-bit memory packages 10, does not need to be tested because this corresponds to a totally complemented correction of a hard failing module which would have been corrected in the complement and retry procedure. Different counter schemes can be used as long as all key combinations are tried. If the counter starts where it has last left off, then $2^n$ counts may be needed. The count need not be a binary progression but may be tailored to first hit expected common failure modes.

Figure 2:
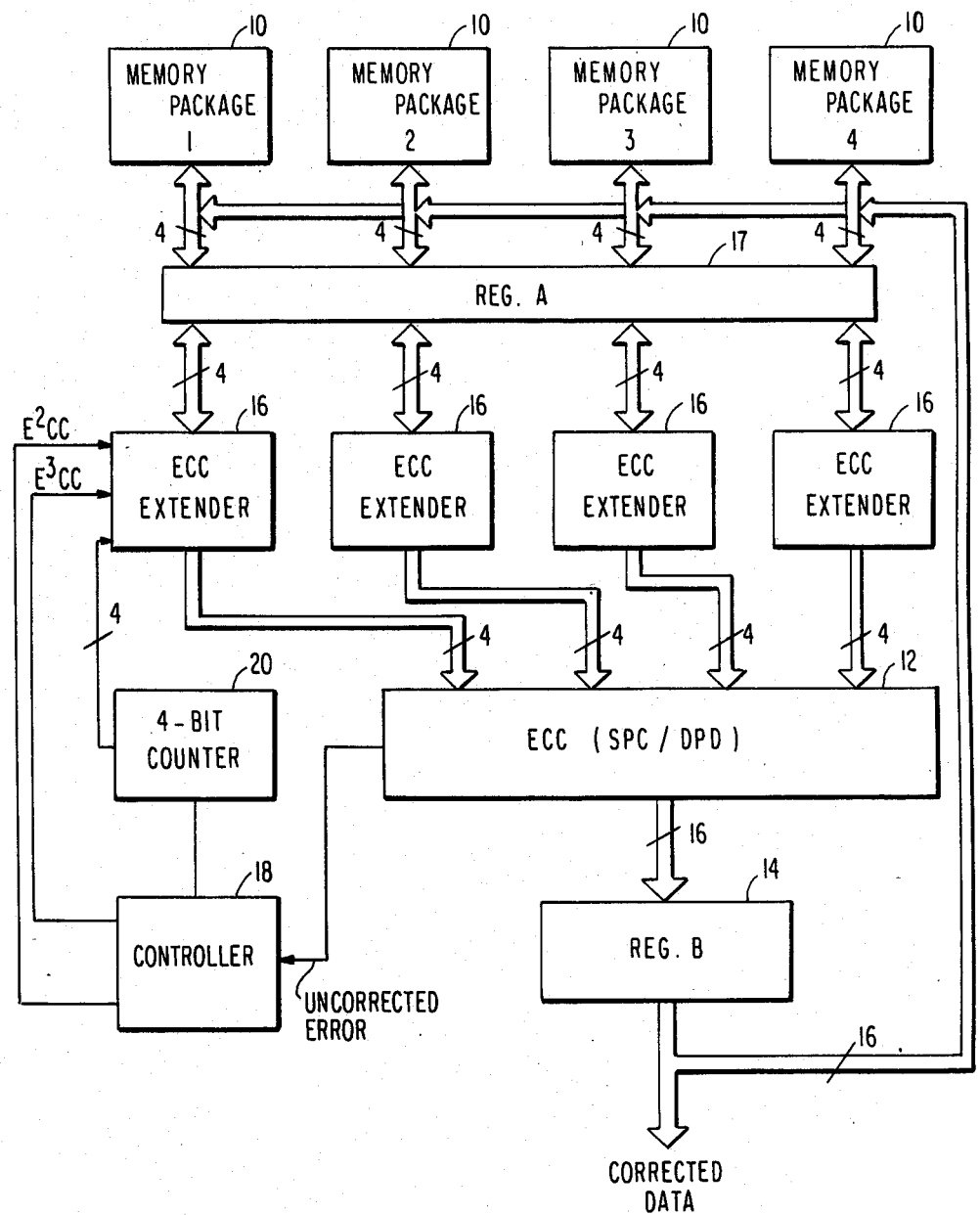
FIG. 2 is a block diagram illustrating a memory system protected by the extended error correction of this invention.

An example of the correction process performed according to the invention is presented in the table of FIG. 2. Three packages are illustrated in this figure although more could be used so long as no other package contains an error. The first row shows the data that is stored in the three packages. It is assumed that the data has been encoded according to a SPC/DPD dode. For sake of example, it is assumed that all four bits of the first package have hard failures and are stuck at a value of 1. Additionally, one bit in the third package is assumed to have suffered a soft failure. As a result, when the data is read as word R, it contains erroneous data in two packages.

When the word R is processed through the ECC, the double package detect code can only indicate that there is an uncorrected error. The complement and retry or $E^2CC$ stage is then begun. The word R is both stored in the ECC extender and is also complemented to $\overline{R}$ to be stored back in the same location in the memory. Then this location is read as word W. Because the first package has all its bits stuck high at 1, these four bits are again read as (1111). The soft failure in the third package does not affect the retrieved value of W that has been stored there. The read word W is then recomplemented to $\overline{W}$ and $\overline{W}$ is then processed through the same ECC. The complement and retry procedure has corrected the first two bits of the first package but has rendered incorrect the final two bits. The soft failure has been maintained by the complement and retry. As a result, the ECC is again faced with double package errors so that the changing or $E^3CC$ stage must be entered.

The bit-by-bit comparison shown in FIG. 1 is not explicitly shown in the table of FIG. 6 because this comparison is performed at each stage of the counter once $E^3CC$ has been entered. Upon entry to $E^3CC$, the counter is set to 1 for the first cycle. Upon a count of 1, the lowest order bit of W is changed (actually not inverted when W is complemented) but only for those packages suffering a hard failure. The asterisks in FIG. 6 indicate the bits of W that are changed. The changed W is then complemented to $\overline{W}$ and $\overline{W}$ is processed through the ECC. Of course, in the described apparatus, the change and the complementing are performed simultaneously.

The one-bit change of W corrected one of the hard errors in the first package but not the other. As a result, the counter is incremented to make another change upon the originally stored value of W. Note that the change to the lowest order bit from cycle 1 does not occur in cycle 2. However, the change of cycle 2 is still insufficient to correct the first package so that the ECC once again indicates a double package error.

On a further count from the counter, both low order bits of the word W are changed. This change produces the correct value of W for the first package, that is, the complement of the data originally stored in the package. Nonetheless, the soft error persists in the value of $W_i$ for the third package. When the changed value of W is complemented to $\overline{W}_i$ and then processed by the ECC, the single package correction code can handle the remaining soft error and correct it to its true value. The corrected value is then passed from the B latches 40 through the A latches 40 to the EEC logic 12 in order to generate new check bits. After being again latched in the B latches 40, it is then stored in memory in order to scrub the soft error in the third package. Of course, the scrubbing operation has no effect on the hard failures in the first package. The corrected value, before or after the restoring step, is also available in the B latches 40 for processing.

The description of the above embodiment has assumed that the sub-fields of the SPC/DPD code are aligned with the boundaries of the multi-bit packages. There is no requirement for this alignment for the practice of the invention and a single package may contain multiple sub-fields or a single sub-field may extend over more than one package. The description has been further based upon the use of a SPC/DPD code. Nonetheless, the invention can be used to enhance other error correction codes implemented in the ECC logic. Examples of these alternate codes are SEC/DED/SPD, SPC/DPD, and SEC/TED. A TED code is one that can detect a triple-bit error. In particular, the $E^3CC$ can also be used to correct a single package error, including any number of erroneous bits within that package, when only a SEC/DED/SPD code exists or it can correct a triple-bit error when only a SEC/TED code exist. In this last case, it can be seen that the sub-field can be associated with a single bit.

It is seen that the invention is applicable to many different codes. For non-package codes, that is, the number of bits per package b=1, the invention is useful when the number of bits m that can be detected exceeds the number of bits n that can be corrected. However, the usefulness is limited by the number s of soft error bits. The number c of erroneous bits that are correctable is c=m if s≦n. When m=n+1, then $E^2CC$ is sufficient since the normal invert-retry method will correct the error.

For package codes b>1, the parameters are redefined as: n equals the package error correction capability; m equals the package error detection capability; s equals the number of packages in which only soft errors occur; and c equals the maximum number of erroneous packages that can be corrected. Then c=m, if s≦n. For package codes, when m=n+1, $E^2CC$ alone will not perform the needed correction unless the data fortuitously line up with the hard fails in a particular fashion.

Although the described embodiment is mostly implemented in hardware, a software implementation or a combination of hardware and software is possible. The advantage of the hardware approach is that the functions can be mostly contained on the memory card and are nearly transparent to the user.

It is seen that the present invention can be advantageously used with an error correction code that can detect more bit errors than it can correct. The operation of the invention requires that at least some of the bits have hard failures. In this case, the locations of the hard fails are isolated by a complement and retry technique. Then the bits associated with the hard failing locations are changed until the ECC no longer detects an error in those changed bits.

Having thus described our invention, what we claim as new, and desire to secure by Letters Patent is:

1. A digital error detection and correction apparatus comprising:
    data source means for providing n-bit error correction-coded code words including data and redundant binary bits, n being an integer, each code word comprising a plurality of sub-words having b bits each, b being an integer, one or more bits of a code word being possibly provided by a faulty element in said data source;
    error correcting means responsive to n-bit code words from said data source means for correcting up to a predetermined number of errors within a code word, said error correcting means providing a corrected code word in the presence of a correctable number and distribution of errors and providing an uncorrectable error output signal in the presence of an uncorrectable number and distribution of errors;
    fault-identifying means for identifying at least one b-bit sub-word of each said code word from said data source means, which sub-word was provided by a faulty element in said data source means;
    sub-word generating means for generating up to $2^b$ unique combinations of said b-bit sub-word; and
    control means responsive to said error correcting means output signal and to said fault-identifying means for substituting a sub-word generated by said sub-word generating means for at least one sub-word of said n-bit code word identified by said fault-identifying means to form a modified code word and for applying said modified code word to said error correcting means, said control means operating cyclically to substitute a different generated sub-word up to $2^b$ times in response to the output signal of said error correcting means.

2. The digital error detection and correction apparatus of claim 1 wherein said fault-identifying means provides an indication of the co-occurrence of errors in at least two sub-words of said n-bit code word and wherein said control means provides for the substitution of a plurality of generated sub-words in a plurality of sub-words of said n-bit code word, which plurality of sub-words were identified by said fault-identifying means.

3. A digital error detection and correction apparatus as recited in claim 1,
    wherein said error correcting means provides said uncorrectable error output signal in the presence of any number of errors within up to a first plurality of sub-words and corrects any number of errors within a number of sub-words less than said first plurality.

4. A digital error detection and correction apparatus as recited in claim 3, wherein b is greater than 1.

5. A digital error-detection and correction apparatus as recited in claim 4, wherein said fault-identifying means identifies at least one of the bit positions of said provided b-bit sub-word.

6. A digital error detection and correction apparatus as recited in claim 1, wherein b is greater than 1.

7. The method of correcting multiple errors in a digital n-bit error correction-coded code word, each code word comprising a plurality of sub-words having b bits each, b being an integer, comprising the steps of:
    a. receiving from a data source an n-bit code word in which one or more bits may be provided by a faulty element in said data source, n being an integer;
    b. executing an error correction procedure on said received n-bit code word to correct up to a predetermined number of errors in a predetermined distribution in said code word and generating an uncorrectable error output signal on the occurrence of errors in excess of said predetermined number of errors in said predetermined distribution;

c. if said uncorrectable error output signal is present, identifying at least one b-bit sub-word provided by a fault in said data source;

d. generating one of the $2^b$ unique combinations of b bits;

e. substituting in said code word said generated combination of b bits for at least one of the identified sub-words provided by a fault in said data source to form a modified sub-word;

f. re-executing said error correction procedure of step b on said modified code word and in the further presence of an uncorrectable error output signal;

g. returning to step d and generating a different one of the $2^b$ unique combinations of b bits; and h. repeating steps e, f, and g until a maximum of $2^b$ iterations of step d have been used to form modified code words which have experienced the execution of step b.

8. A method of correcting multiple errors as recited in claim 7, wherein said identifying step identifies a bit position in said identified sub-word.

* * * * *